United States Patent [19]

Belanger, Jr.

[11] Patent Number: 4,821,149

[45] Date of Patent: Apr. 11, 1989

[54] SUBSTRATE MOUNTING DEVICE

[75] Inventor: Thomas D. Belanger, Jr., Clarendon Hills, Ill.

[73] Assignee: GTE Communication Systems Corporation, Phoenix, Ariz.

[21] Appl. No.: 101,904

[22] Filed: Sep. 28, 1987

[51] Int. Cl.⁴ .............................................. H05K 1/18
[52] U.S. Cl. .................................... 361/395; 211/41; 361/399; 361/413; 361/415
[58] Field of Search ............... 361/412, 413, 415, 399, 361/394, 419; 211/41; 312/185, 187, 192, 323

[56] References Cited

U.S. PATENT DOCUMENTS

| 4,505,394 | 3/1985 | Reiemer | 211/41 |
| 4,573,104 | 2/1986 | Kamada | 361/415 X |
| 4,574,755 | 10/1986 | Roberts | 361/399 X |
| 4,688,149 | 8/1987 | Inoue et al. | 361/413 X |
| 4,716,497 | 12/1987 | Craker | 361/399 X |

FOREIGN PATENT DOCUMENTS 3335820 4/1985 Fed. Rep. of Germany ...... 361/412

Primary Examiner—R. R. Kucia
Attorney, Agent, or Firm—Anthony Miologos

[57] ABSTRACT

A substrate mounting device for installing an electrical substrate to a carrier substrate. The substrate mounting device includes a plurality of tabs extending from the perimeter edges of the electrical substrate. First and second substrate guides are mounted to the carrier substrate and each include a lower shelf and a channel extending longitudinally along a substrate guide inner side, from an open end to a top guide. The channel is further defined by a top surface and a plurality of drop guides which in turn from a plurality of slots. The electrical substrate is installed by manually inserting the electrical substrate into a respective substrate guide open end and manually pushing the electrical substrate along the channels until the electrical substrate encounters a respective top guide whereby, the electrical substrate is urged downward. Each tab then falls within a respective slot, resting the electrical substrate on the lower shelf.

7 Claims, 1 Drawing Sheet

SUBSTRATE MOUNTING DEVICE

BACKGROUND OF THE INVENTION

This invention relates in general to modular electronic circuit devices and more particularly to a device for mounting electrical substrates to a carrier substrate.

In the past few years, the use of plug-in units for electrical components has found favor within the electronics industry. Such plug-in units generally comprise a structure upon which are mounted electrical assemblies or sub-assemblies, the structure being arranged to be plugged in a suitable socket provided on a base chassis. When so plugged the components carried by the plug-in unit are electrically connected in proper circuit relation to other electrical equipment carried by the base chassis.

Recently however, with the coming of film circuits, the need for a specialized carrier structure for housing the sub-assembly has disappeared. This is mainly due to the smaller size of a film circuit. Compared to circuit fashioned in discrete components the film circuit is appreciably smaller and lighter. It is not uncommon to have film circuits plugged directly into larger circuit cards or other carrier substrates and in turn the larger substrate plugged into the base chassis. At present, most installations of film circuits to circuit cards is done as a permanent installation. Therefore, removal and replacement of the film circuits though not impossible, is a tedious and labor intensive job.

It therefore is an object of the present invention to disclose a new structure for mounting, electronic substrates onto carrier substrates.

SUMMARY OF THE INVENTION

In accomplishing the object of the present invention there is provided a substrate mounting device for mounting an electrical substrate to carrier substrate. The electrical substrate of the present invention includes a first pair of tabs each extending from the major perimeter edges of the electrical substrate directly opposite one another. A second pair of tabs located in a spaced relationship to the first pair of tabs also extend from the major perimeter edges of the electrical substrate directly opposite the other.

The substrate mounting device further includes first and second substrate guides located in a spaced and parallel relationship to each other and each including a lower shelf. Each lower shelf includes a bottom surface mounted to the carrier substrate. Each of the substrate guides further include a channel extending longitudinally along an inner side of each respective guide from an open end to a top guide. The channel is further defined by a top surface and first and second drop guides. The first and second drop guides further define first and second slots.

The electrical substrate and the first and second tabs are manually inserted into respective first and second substrate guide channels at respective channel open ends and manually pushed along the channels. The electrical substrate rides between the respective guides first and second drop guide and top surface until the substrate encounters the top guide. Each respective top guide urges the electrical substrate downward whereby, the first tab and the second tab fall within respective first and second slots on each of the first and second substrate guides thereby, resting the electrical substrate guide on the lower shelf.

The electrical substrate can be provided with some means of electrical connection device which would contact or mate with similar devices mounted on the carrier substrate. This could provide for electrical connections between the electrical substrate and the carrier substrate.

BRIEF DESCRIPTION OF THE DRAWINGS

A better understanding of the invention may be had from the consideration of the following detailed description taken in conjunction with the accompanying drawings in which.

DESCRIPTION OF THE PREFERRED EMBODIMENT

Figure 1:
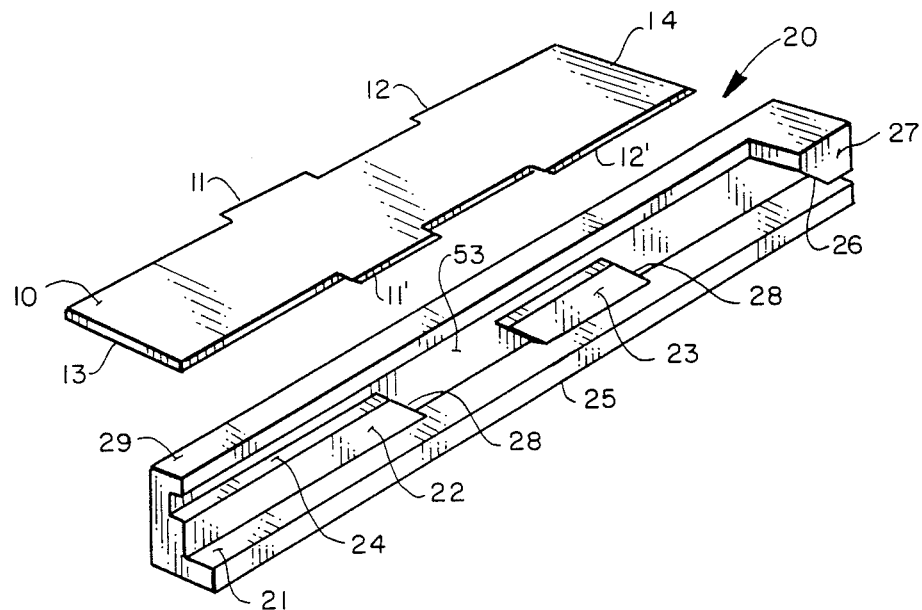
FIG. 1 is a perspective view of an electrical substrate and substrate guide of the present invention.

Turning now to FIG. 1 of the included drawings the device in accordance with the invention includes a planar electrical substrate 10 having a first set of tabs 11, 11' extending outward from the edges of the substrates 10 major sides. A second set of tabs 12, 12' also extend outward from the major sides of the electrical substrate 10. As can be seen in FIG. 1 the first set and second set of tabs extend outward of the electrical substrate in the same horizontal plane. The electrical substrate further includes a handle end 13 and a lead edge 14.

Guide 20 (a left side substrate guide) is an integrally molded unit comprised of a slot or channel 24 extending longitudinally along an inner side of guide 20. Channel 24 is defined between a planar top cap or surface 29 and a forward drop guide 22 and rear drop guide 23. Additionally, the channel 24 extends from an opening at the forward end of the guide 20 to a top guide 27 at the rear of the guide 20. Both the forward and rear drop guides include ramped ends 28 to aid in the positioning and removal of the substrate 10. Further, the top guide 27 includes an angled surface 26 which also aids in the installation of substrate 10 and which will be explained in detail later. Finally, guide 20 includes a lower shelf 21 and a generally planar bottom surface 25 for mounting the guide to a carrier substrate.

Figure 2:
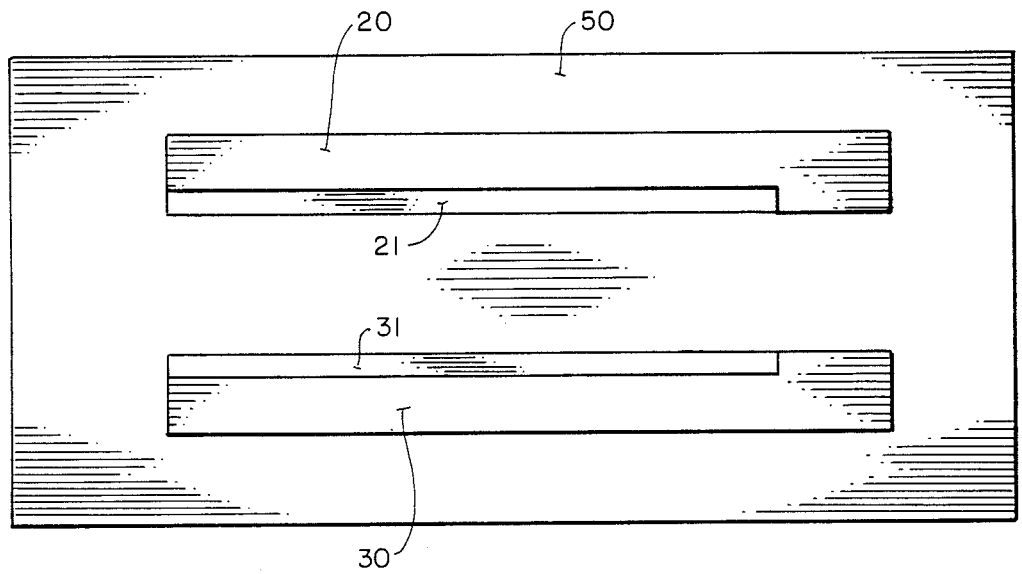
FIG. 2 is a top plan view of the substrate mounting device of the present invention mounted on a carrier substrate.

The left substrate guide 20 shown in FIG. 1, and a right substrate guide 30 form the substrate mounting device of the present invention shown in FIG. 2. The right substrate guide 30 is a mirror image in structure to guide 20.

The substrate mounting device of the present invention is attached by any convenient means to the top surface of a carrier substrate 50 such as a circuit card, backplane, or other electrical substrate.

With renewed reference to FIG. 1 an explanation of the installation of the substrate 10 within the substrate mounting device of the present invention will be explained in detail. It should be noted that the installation will use only the left substrate guide 20 shown in FIG. 1. It will be appreciated by those skilled in the art that an identical insertion procedure occurs simultaneously in guide 30 as the substrate is installed.

The electrical substrate 10 including tabs 11 and 12 is grasped at handle end 13 and manually inserted via lead edge 14 into channel 24 of guide 20 and pushed forward within the guide. During insertion the substrate 10 rides within the channel between the forward drop guide 22, rear drop guide 23 and the top cap 29. The forward tab 12 being longer than the rear slot 53, which is defined by the forward drop guide 22 and rear drop guide 23, rides over the rear slot 53 on insertion.

The substrate 10 is installed further into guide 20 substrate tabs 11 and 12 become keyed to slots 53 and 52 respectively. Angled surface 26 of top guide 27 insures that substrate 10 follows a downward motion as it is further pushed within the guide. Angled surfaces 28 on the rear and forward drop guides facilitate the substrate sliding down onto the lower shelf 21 as the top guide 27 pushes the substrate downward.

Finally, the substrate is fully installed when the electrical substrate rests completely on the lower shelf 21.

It will be appreciated by those skilled in the art that the substrate 10 can be provided with some means of electrical connection devices which would contact or mate with similar devices mounted on carrier substrate 50. This would provide electrical connection between substrate 10 and the carrier substrate 50.

The substrate is easily removed by pulling the substrate 10 out of the guide 20 in an opposite direction to that of installation. A lifting action is provided by angled ends 28 of of drop guides 23 and 22. Once the substrate 10 is within channel 24 the substrate is pulled and withdrawn from the guide.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A substrate mounting device for mounting an electrical substrate to a carrier substrate comprising:
   a first pair of tabs each extending from a major perimeter edge of said electrical substrate directly opposite each other;
   a second pair of tabs located in a spaced relationship to said first pair of tabs and said second pair of tabs extending from a perimeter edge of said electrical substrate directly opposite each other;
   first and second substrate guides located in a spaced and parallel relationship to each other and each including a lower shelf with each lower shelf having a top and a bottom surface, and each bottom surface mounted to said carrier substrate, each of said substrate guides further including a channel longitudinally oriented along a first side thereof, and each of said channels including an open end and a top guide, and each channel extends between said open end and said top guide, each channel further defined by a top surface and first and second drop guides, said first and second drop guides located on said lower shelf top surface directly opposite said channel top surface, said first and second drop guides further defining first and second tab receiving slots; and,
   said electrical substrate and said first pair and said second pair of tabs are arranged to be manually inserted into respective first and second substrate guide channels at respective channel open ends and manually pushed along said channels riding between respective first and second drop guides and channel top surfaces until said substrate encounters a respective top guide, whereby, said first pair of tabs and said second pair of tabs fall within respective first and second tab receiving slots, resting said electrical substrate and said first and second pair of tabs on a respective first and second substrate guide lower shelf top surface.

2. A substrate connector guide for mounting and electrically connecting an electrical substrate to a carrier substrate comprising:
   first tab means located on a first perimeter edge of said electrical substrate;
   second tab means located on a second perimeter edge of said electrical substrate directly opposite said first tab means;
   first and second guide means including a lower shelf mounted to said carrier substrate in a spaced and parallel relationship to each other, each of said guide means further including a channel longitudinally oriented along a first side thereof, and each channel extending between an open end and a terminating end, and each channel further including at least one tab means accepting slot; and,
   said electrical substrate and said first and second tab means arranged to be manually inserted into respective first and second substrate guide means channels at respective channel open ends and urged along each of said guide means channels toward said terminating end until said first tab means and said second tab means fall within respective first and second guide means accepting slots, resting said carrier substrate on a respective first and second guide means lower shelf.

3. The substrate connector guide as claimed in claim 2, wherein: said first tab means is a first pair of tab members oriented in tandem, extending from a first major perimeter edge of said electrical substrate.

4. The substrate connector guide as claimed in claim 3, wherein: said second tab means is a second pair of tab members oriented in tandem directly opposite of said first tab means, extending from a second major perimeter edge of said electrical substrate.

5. The substrate connector guide as claimed in claim 4, wherein: each of said first and second guide means lower shelf includes top and bottom surfaces and each first and second guide means channels is defined by a top surface and first and second drop guides positioned in tandem extending from said lower shelf top surface, said guide means first and second drop guides further defining first and second tab member accepting slots.

6. The substrate connector guide as claimed in claim 5, wherein: said electrical substrate and said first and second pair of tab members are inserted within respective first and second guide means channels at respective channel open ends, and said electrical substrate is manually pushed along each respective channel with said first and second pair of tab members riding between respective first and second guide means drop guides and top surfaces until each of said first and second pair of tab members fall within respective first and second tab member accepting slots.

7. The substrate connector guide as claimed in claim 6, wherein: each of said first and second guide means terminating ends is a top guide which extends into respective first and second guide means channels, and each top guide is arranged to contact said electrical substrate when riding within each respective channel, thereby urging said electrical substrate in a direction toward said first and second drop guides.

* * * * *